United States Patent [19]

Yonezawa

[11] 4,434,367

[45] Feb. 28, 1984

[54] ELECTRON MICROSCOPE

[75] Inventor: Akira Yonezawa, Fussa, Japan

[73] Assignee: International Precision Incorporated, Tokyo, Japan

[21] Appl. No.: 287,788

[22] Filed: Jul. 28, 1981

[30] Foreign Application Priority Data

Jul. 28, 1980 [JP] Japan .................................. 55-102352

[51] Int. Cl.³ ........................ H01J 37/09; H01J 37/26
[52] U.S. Cl. ................................................... 250/311
[58] Field of Search ................................. 250/311, 396

[56] References Cited

U.S. PATENT DOCUMENTS

| | | | |
|---|---|---|---|
| 3,795,809 | 3/1974 | Takashima | 250/311 |
| 3,852,597 | 12/1974 | Yanaka et al. | 250/311 |
| 4,121,100 | 10/1978 | Kubozoe et al. | 250/311 |
| 4,246,487 | 1/1981 | Anger et al. | 250/396 |

Primary Examiner—Alfred E. Smith
Assistant Examiner—Jack I. Berman
Attorney, Agent, or Firm—Lane, Aitken & Kananen

[57] ABSTRACT

An electron microscope comprises an objective lens, at least an intermediate lens and a projector lens arrayed in this order on an optical axis. A movable aperture element is disposed between the objective lens and the intermediate lens whose disposition and magnetic excitation are so selected that electron beam diverging from a crossover produced at a back focal plane of the objective lens is focused on a plane of the movable aperture element. In the case of an electron microscope comprising an objective lens, an objective aperture element, a selected area aperture element, at least an intermediate lens and a projector lens arrayed in this order along an optical axis, an additional lens is disposed between the objective aperture element and the selected area aperture element. Disposition and magnetic excitation of the additional lens are so selected that electron beam diverging from a crossover produced at a back focal plane of the objective lens is focused at a plane of the selected area aperture element. In both electron microscopes, divergence angle of the electron beam scattered by a specimen is restricted by the movable aperture element or the selected area aperture element.

4 Claims, 3 Drawing Figures

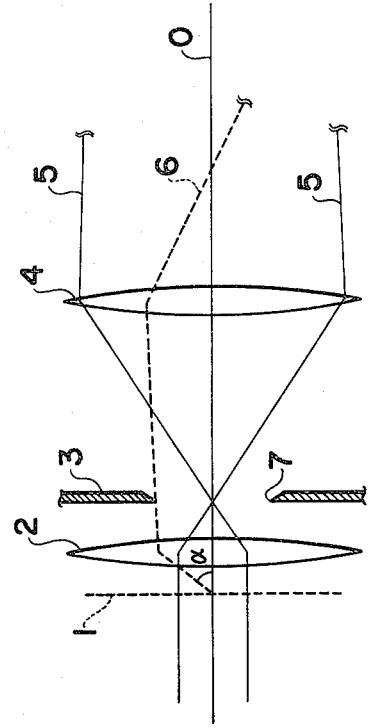
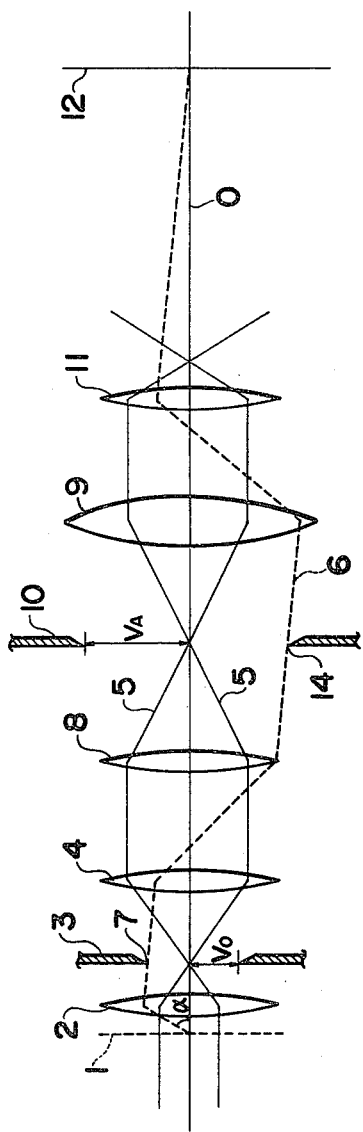

ELECTRON MICROSCOPE

BACKGROUND OF THE INVENTION

1. Field of the Invention

The present invention relates in general to an electron microscope, and in particular concerns an improvement of an electron microscope in which contrast of microscopic images is improved with various aberrations being concurrently reduced.

2. Description of the Prior Art

In the electron microscopes, and among all in a conventional transmission electron microscope, the image contrast is attained by limiting the divergence angle of electron beams scattered by the specimen. It will be helpful for having a better understanding of the present invention to describe at first a hitherto known approach in some detail. Referring to FIG. 1 of the accompanying drawings which shows schematically and partially a lens system of a hitherto known electron microscope, there is inserted a movable objective aperture member 3 on an optical axis O in a gap between magnetic pole pieces of a conventional objective lens 2 on the side of an imaging lens 4 as viewed from the side of a specimen 1. The objective aperture member 3 serves for limiting a divergence angle $\alpha$ of electron beam 6 scattered by the specimen 1 which beam will hereinafter be referred to as the scattered electron beam. To this end, the objective aperture member 3 is usually formed of a metallic thin membrane and has a circular bore 7 formed therein with a diameter on the order of 20 $\mu$m. Implementation of the circular bore 7 of a diameter smaller than 20 $\mu$m will encounter a great difficulty in fabrication and thus is impractical. Further, the objective aperture member 3 having such an extremely fine bore is likely to incur degradation of the image quality due to contamination of the aperture member or the like factors, rendering the use of such aperture member impractical.

However, in a certain type of the electron microscope, and particularly in a high resolution electron microscope in which an objective lens of a short focal length is employed, there exists a demand for further decreasing the divergence angle $\alpha$ of the scattered electron beam 6 by resorting to the use of the objective aperture member 3 having the bore 7 of a smaller diameter. Nevertheless, it has been practically impossible to realize an optimal diameter for the objective aperture member in view of the difficulty in attaining the desired dimensional accuracy as well as the possibility of involving degradation in the image quality.

On the other hand, in the application in which the electron microscope is operated at a small magnification on the order of several thousand or less magnifications, there is known a method of improving the contrast of image according to which the divergence angle $\alpha$ of the scattered electron beam 6 is restricted by displacing a back focal plane of the objective lens 2 to a plane of an aperture for restricting field of view (which will hereinafter be referred to as the field restricting selected area aperture and is shown in FIG. 3) by varying correspondingly the magnetic excitation of the objective lens 2. This method is however disadvantageous in that the spherical aberration coefficient Cs as well as the chromatic aberration coefficient Cc tends to be significantly increased due to the fact that the magnetic excitation of the objective lens 2 is changed to an extremely low excitation level, resulting in that the quality of image is remarkably deteriorated to a great disadvantage, when observation is to be conducted at several thousand magnifications.

Moreover, because the objective aperture member 3 is usually inserted between the pole pieces of the objective lens, the inter-pole gap (i.e. the gap between the pole pieces of the objective lens) can not be decreased in order to assure a desired angular range for permitting a tilt or inclination of the specimen, which in turn gives rise to a troublesome problem that the spherical aberration coefficient Cs and the chromatic aberration coefficient Cc become very difficult to decrease, in addition to a problem that the vacuum state in the vicinity of the specimen is likely to be deteriorated.

SUMMARY OF THE INVENTION

An object of the present invention is to provide an electron microscope which is substantially immune from the drawbacks of the hitherto known microscopes described above.

In view of the above and other objects which will become more apparent as description proceeds, there is proposed according to an aspect of the present invention an electron microscope which comprises an objective lens, at least an intermediate lens and a projector lens both of which are disposed at respective positions downstream of the objective lens, an objective aperture element disposed between the objective lens and the intermediate lens, and a movable aperture element provided separately and independently from the objective aperture element at an appropriate position between the intermediate lens and the projector lens, wherein an electron beam or flux diverged from a crossover point located at a back focal point of the objective lens is focused or converged onto a plane of the movable aperture element by correspondingly setting magnetic excitation of the intermediate lens, to thereby allow the movable aperture member to limit or restrict the divergence angle of electron beams scattered by the specimen. With the arrangement of the electron microscope described above, the divergence angle of the scattered electron beam or flux can be restricted to a smaller value as compared with the hitherto known system for restricting the divergence angle with the aid of the movable objective aperture element, whereby contrast as well as quality of the produced image can be significantly improved. On the other hand, the teaching of the invention makes it possible to use the movable aperture element having a bore of a relatively large diameter, to thereby protect the quality of the produced image from being deteriorated due to contamination of the movable aperture element. Besides, by virtue of such arrangement that the divergence angle of the scattered electron beam is restricted by means of the movable aperture element in place of the objective aperture element, there is available an adequate space for allowing the specimen to be tilted or inclined within an enlarged angular range. Further, the inter-pole gap can be reduced to thereby decrease the spherical aberration coefficient Cs and the chromatic aberration coefficient Cc, whereby the resolution or resolving power of the electron microscope can be significantly enhanced. The vacuum level in the vicinity of the specimen can be maintained satisfactorily.

According to another feature of the present invention, there is provided an electron microscope which includes a selected area aperture element disposed at a position downstream of an objective aperture element and an additional intermediate lens disposed between the selected area aperture element and the objective aperture element, wherein electron beam or flux diverging from a crossover point on a back focal plane of the objective lens can be focused or converged onto the plane of the selected area aperture element by setting appropriately the magnetic excitation of the additional intermediate lens. With such arrangement of the electron microscope, it is possible to restrict the divergence angle of electron beam scattered by a specimen, whereby improvements in respect of contrast and quality of produced images can advantageously be accomplished without incurring any appreciable increase in the number of the structural components.

BRIEF DESCRIPTION OF THE DRAWINGS

FIG. 1 shows schematically and partially a lens system of a hitherto known electron microscope in which divergence angle of electron beam scattered by a specimen is restricted by an objective aperture element;

FIG. 2 illustrates schematically a lens system of an electron microscope according to an embodiment of the invention in which the divergence angle of electron beam scattered by a specimen is restricted by an additionally provided movable aperture member.

DESCRIPTION OF THE PREFERRED EMBODIMENTS

Figure 3:
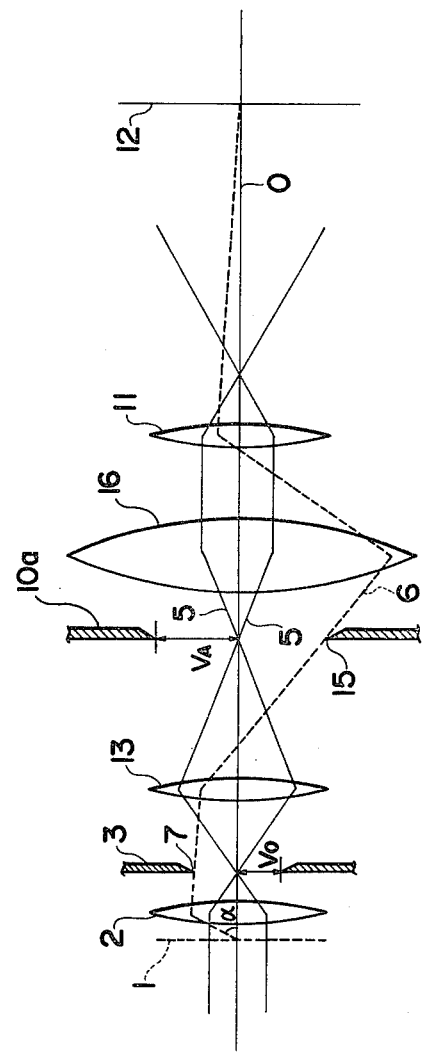
FIG. 3 illustrates schematically a lens system of an electron microscope according to another embodiment of the present invention.

Now, the invention will be described by referring to FIGS. 2 and 3 which show embodiments of the invention, by way of example only.

Referring first to FIG. 2 which shows a lens system of the electron microscope according to a first embodiment of the invention, it comprises an objective lens 2 disposed downstream (i.e. on the rear side) of a specimen 1, an objective aperture element 3 disposed on a back focal plane at which a crossover of electron beam 5 is formed, a number of intermediate lenses 4, 8 and 9 disposed downstream of the objective aperture element 3 for modifying a path of the electron beam 5 in various manners, and a projector lens 11 for projecting the electron beam flux onto the plane of a projection screen 12 (e.g. a photosensitive film). Although three intermediate lenses are shown as employed in the case of the illustrated embodiment, it will be understood that the invention is never restricted to the use of the three intermediate lenses, but arrangement may be made such that one or two or more than three intermediate lenses may be disposed between the objective lens and the projector lens 11. According to the teaching of the invention, a movable aperture element 10 is additionally provided at an appropriate position between a principal plane of the intermediate lens 4 located closest to the objective lens 2 (which intermediate lens 4 will hereinafter be referred to as the first intermediate lens) and a principal plane of the projector lens 11. The intermediate lenses disposed upstream of the movable aperture element 10 are magnetically so excited that the electron beam 5 diverging from the crossover produced at the back focal plane of the objective lens 2 is converged again at the position of the movable aperture element 10. In the case of the illustrated embodiment, the movable aperture element 10 is disposed between the intermediate lens 8 (hereinafter referred to as the second intermediate lens) and the intermediate lens 9 (hereinafter referred to as the third intermediate lens). The reconvergence (i.e. crossover) of the electron beam 5 at the position of the movable aperture element 10 can be accomplished through selection of the magnetic excitation of the first intermediate lens 4 and the second intermediate lens 8, respectively. The electron beam thus converged at the position of the movable aperture element 10 is again diverged and refracted under action of the third intermediate lens 9 and the projector lens 11 to be projected onto the screen 12.

With the arrangement of the electron microscope described above, it is assumed that the electron beam 6 is scattered by the specimen 1 at an angle $\alpha_o$, intersects the objective aperture element 3 as indicated by 7 at the back focal plane of the objective lens 2 and, after having been refracted by the first and the second intermediate lenses 4 and 8, intersects the movable aperture element 10 at a point 14, thereby to be projected onto the projector plane 12 by the projecting lens 11 in succession to refraction by the third intermediate lens 9. When a distance between the optical axis 0 and the point 7 is represented by Vo, while a distance between the optical axis 0 and the point 14 is represented by $V_A$, then the condition that $Y_O < V_a$(e.g. $V_A \approx 3 V_O$) can be realized easily by appropriately disposing and exciting the first intermediate lens 4 and the second intermediate lens 8.

By way of illustrative example, it is assumed that a distance between the objective lens 2 and the first intermediate lens 4 is 50 mm, a distance between the first intermediate lens 4 and the second intermediate lens 8 is 100 mm, a distance between the second intermediate lens 8 and the movable aperture element 10 is 100 mm, the focal length of the objective lens 2 is 1.5 mm, a half-width of the magnetic field of the first intermediate lens 4 along the optic axis is 8 mm, and that the half-width level of the magnetic field of the second intermediate lens 8 along the optic axis is 12 mm.

On the above assumption, the path of the paraxial electron beam in the lens system described above can be obtained as a solution of the following equation, provided that rotation of electron around the axis is not taken into consideration. That is, $$\frac{d^2y}{dz^2} + \frac{eBz^2(Z)}{8m_oU\divideontimes} y(Z) = 0 \qquad (1)$$

where y represents the distance from the optical axis to the path of the paraxial electron beam, Bz(Z) represents distribution of the magnetic field along the optical axis (or Z-axis) in a lens of a rotationally symmetric magnetic field type, e represents electric charge on an electron, $m_o$ represents mass of an electron and U✻ represents the relativistically corrected accelerating voltage. For particulars, reference is to be made to a literature "Grundlagen der Elektronenoptik" of W. Glaser.

Now, let's determine the travel path of an electron beam incident to the specimen perpendicularly thereto and an electron beam scattered by the specimen 1 at an angle $\alpha = 10^{-2}$ rad. in accordance with the expression (1). Assuming that the excitation J/√U✻ of the first intermediate lens 4 is about 4.5 AT/V^½(apere-turn-/√voltage) and that the excitation J/√U✻ of the second intermediate lens 8 is about 2.5(AT/V⁻), where J represents the magnetomotive force of the objective lens in ampere-turn, the electron beam 5 is once focused on the back focal plane of the objective lens 2 and subsequently focused again on the plane of the movable aperture element under the action of the first and the second intermediate lenses 4 and 8, as can be seen from FIG. 2. Further, from the calculation of the travel path for the scattered electron beam 6, it is determined that $V_O \approx 15$ ($\mu$m) and that $V_A \approx 50$ $\mu$m.

Thus, it is possible to restrict the divergence angle of the scattered electron beam 6 to a substantially same degree as the objective aperture element 3 by using the movable aperture element 10 having a bore diameter about three times as large as that of the objective aperture element 3. This means that the movable aperture element 10 which can be more easily fabricated than the objective aperture element 3 can be used to effectively restrict the divergence angle of the scattered electron beam 6 with the aperture element 10 being protected from contamination and thus preventing the quality of produced image from being deteriorated. On the other hand, when the movable aperture element 10 having a smaller bore diameter is employed, the divergence angle of the scattered electron beam can be made smaller than $\alpha$, because the scattered electron beam running nearer to the optical axis 0 than the point 14 can be shut off. More specifically, when a same aperture element as the objective aperture element 3 is used for the movable aperture element 10, the divergence angle of the scattered electron beam 6 can be decreased to about one third of the angle $\alpha$, whereby the contrast of the image produced on the screen or projection plane 12 can be significantly improved. In this connection, it is to be noted that the blur brought about due to the off-axis astigmatism or curvature of field is proportional to the divergence angle $\alpha$ (rad.) of the scattered electron beam 6, as is disclosed in the literature cited hereinbefore. Thus, the image quality can be improved, as the off-axis aberrations are reduced. By the way, modification in magnification of the electron microscope can be made by varying the magnetic exitation of the third intermediate lens 9 and the projector lens 11, and observation of a diffraction pattern produced on the plane of the movable aperture element 10 is also possible.

It should here be mentioned that when a plurality of the movable aperture elements 10 may be provided with the electron beam being focused at a position of an appropriate one of the plural movable aperture elements 10, it is possible to make available a larger range of magnification than the one available in the focusing system illustrated in FIG. 2. For example, when another movable aperture element (not shown) is additionally disposed between the first intermediate lens 4 and the second intermediate lens 8 in the lens system of the electron microscope illustrated in FIG. 2 in such arrangement that the electron beam is focused onto the plane of this additional aperture element, an imaging or focusing mode of a higher magnification can be established by restricting the divergence angle of the scattered electron beam by means of the additionally provided movable aperture element. In practice, however, it is difficult to attain several ten thousand magnifications in the lens system which is composed of five stages as in the case of the embodiment illustrated in FIG. 2. For this reason, in the case where a higher magnification is desired in the lens system of five stages, the restriction of the divergence angle should preferably be effected by means of the objective aperture element 3 without resorting to the use of the movable aperture element.

Now, aberrations will be considered. In the imaging or focusing mode illustrated in FIG. 2, the spherical aberration coefficient Cs and the chromatic aberration coefficient Cc can be made substantially the same as those appearing in the focusing mode in which only an objective lens is made use of. More particularly, the spherical aberration coefficient Cs and the chromatic aberration coefficient Cc in the lens system can be determined on the basis of the following expressions:

$$Cs = \frac{e}{96 m_o U^{\frac{1}{2}}} \int_{Z_0}^{Z_1} \left( \frac{2e}{m_o U^{\frac{1}{2}}} Bz^4 + 5B'^2 - BzB''z \right) y(z)^4 dz \quad (2)$$

$$Cc = \frac{e}{8 m_o U^{\frac{1}{2}}} \int_{Z_0}^{Z_1} Bz^2 y(z)^2 dz \quad (3)$$

where $Z_o$ represents the position of the specimen, and $Z_1$ represents the position of an image plane. Initial conditions are $y_o = 0$ and $y_o' = 1$ at $Z = Z_o$ with $Z_1$ being taken at the projection plane 12.

In general, in the case of operation at a high magnification, the value of y of the lenses other than the objective lens is extremely small compared to the corresponding value of the objective lens. Accordingly, the aberration coefficients Cs and Cc of the whole lens system are substantially same as those of the objective lens alone.

In the lens system illustrated in FIG. 2, the values of y of the second and the third intermediate lenses 8 and 9 are about three times as high as the value of y of the objective lens 2. However, because intensity of excitation of these intermediate lenses 8 and 9 is lower than that of the objective lens and additionally the lens gap bore diameter of the intermediate lenses 8 and 9 is greater than that of the objective lens 2, the maximum value of the magnetic flux density of the intermediate lens can be made substantially equal to about 1/20 of the magnetic flux density of the objective lens 2. Thus, the terms of the expressions (2) and (3) which include the magnetic flux density Bz are of significantly smaller values than the corresponding ones of the objective lens 2, whereby contribution of the second intermediate lens 8 and the third intermediate lens 9 to the integrals can be made smaller than that of the objective lens 2.

For example, in the lens system described above in which the spherical aberration coefficient Cs and the chromatic aberration coefficient Cc of the objective lens 2 are selected equal to 0.8 mm and 1.0 mm, respectively, the values of the aberration coefficients Cs and Cc of the whole imaging lens system are equal to 0.88 mm and 2.0 mm, respectively, as calculated on the basis of the second and the third expressions on the assumption that the half-width level of the magnetic field of the third intermediate lens is 14 mm and the magnetic excitation $J/\sqrt{U}$ is 6(AT/V$^{\frac{1}{2}}$), and that the half-width of the magnetic field and the excitation of the projector lens 11 and 3 mm and 10(AT/V$^{\frac{1}{2}}$), respectively. In other words, the aberration coefficients Cs and Cc of the whole lens system of the electron microscope described above will not exceed to a great extent the values of the aberration coefficients Cs and Cc of the objective lens 2.

Accordingly, by increasing the number of lens stages which follow the movable aperture element 10 in the lens system shown in FIG. 2, it is possible to perform observation with a high resolution and a high magnification on the order of several hundreds of thousands or more magnifications. In this connection, it should be noted that the divergence angle of the electron beam 6 scattered by the specimen can be restricted only through the movable aperture element 10 without using the objective aperture element 3 in the wide magnification range up to about one million.

FIG. 3 shows a lens system of an electron microscope according to another embodiment of the present invention in which an additional intermediate lens 13 is interposed between the objective lens 2 and a movable selected area aperture element 10a which is disposed downstream of the objective aperture member 3, wherein the electron beam diverging from a crossover produced at the back focal plane of the objective lens 2 is again focused at a plane (or position) of the selected area aperture element 10a by setting the magnetic excitation of the additional intermediate lens 13, to thereby restrict the divergence anale α of the electron beam scattered by the specimen 1 by means of the selected area aperture element 10a. With the arrangement described above, the electron beam 6 scattered by the specimen 1 intersects the objective aperture element 3 at a point 7 on the back focal plane of the objective lens 2 and subsequently, after having undergone refraction under the action of the additional intermediate lens 13, intersects the selected area aperture element 10a at a point 15. When a distance between the optical axis 0 and the point 7 is represented by $V_o$, while a distance between the optical axis 0 and the point 15 is represented by $V_B$, the condition that $V_o < V_B$ can be realized by selecting appropriately the disposition of the selected area aperture element 10a and the magnetic excitation of the intermediate lens 13, as in the case of the lens system described hereinbefore in conjunction with FIG. 2. In other words, it is possible to restrict the scattered electron beam 6 to a substantially same degree as the objective aperture element 3 by using the selected area aperture element 10a which has a bore of a greater diameter than that of the objective aperture member 3. The lens system shown in FIG. 3 provides advantages similar to those of the lens system illustrated in FIG. 2 and is additionally advantageous in that the restriction of the divergence angle α of the scattered electron beam 6 can be accomplished by the selected area aperture element which is inherently provided in the electron microscope without necessity of providing an additional movable aperture element.

The lens systems of electron microscopes according to the first and the second embodiments of the invention described above have a common feature in that the divergence angle of the electron beam scattered by the specimen 1 is restricted or limited by the aperture member which is provided separately and independently from the objective aperture member 3 and disposed between the intermediate lens 4 or 13 positioned downstream of and adjacent to the objective lens 2 and the projector lens 11. By the way, it is noted that a fixed aperture member is usually provided for the projector lens and or other lens in order to suppress electron beams reflected from walls of magnetic pole pieces and or preventing gas flowing into a region in the vicinity of the specimen. However, it should be appreciated that the fixed aperture member of this type is neither intended nor operative to restrict the divergence angle of the electron beam scattered by the specimen and thus distinctly differs in essence from the movable aperture elements 10 and 10a provided according to the teaching of the present invention.

As will be appreciated from the foregoing description, the lens system for the electron microscope according to the invention in which the divergence angle of the electron beam scattered by a specimen can be restricted or limited by the movable aperture member disposed between the intermediate lens and the projector lens at the side downstream of the objective lens or alternatively by disposing the additional intermediate lens between the objective lens and the selected area aperture member so that the electron beam is focused at the position of the movable aperture member or the selected area aperture member allows the image contrast as well as the image quality to be improved excellently over the hitherto known electron microscope in which the divergence angle of the electron beam is restricted by the objective aperture element. Further, a great degree of freedom for the inclination or tilt of the specimen can be assured in addition to the advantages that the spherical aberration coefficient and the chromatic aberration coefficient of the objective lens can be decreased, while the resolution is enhanced. Further, because the movable aperture element is disposed with a relatively great distance from the specimen, degradation in vacuum level in the vicinity of the specimen can be effectively prevented.

I claim:

1. An electron microscope comprising an objective lens, at least one intermediate lens disposed backward of said objective lens, a projector lens disposed backward of said intermediate lens, and a movable aperture element disposed at a selected position between a principal plane of the intermediate lens located closest to said objective lens and a principal plane of said projector lens, wherein a first crossover is produced at the back focal plane of the objective lens, and the electron beam diverging from said first crossover is again focused at a plane of said movable aperture element to produce a second crossover by setting magnetic excitation of said intermediate lens at an appropriate level, to thereby restrict the divergence angle of the electron beam scattered by a specimen.

2. An electron microscope as set forth in claim 1, in which at least two intermediate lenses are provided between said objective lens and said movable aperture element, wherein disposition and magnetic excitation of said intermediate lenses are so selected that a condition that $V_O < V_A$ is satisfied, in which $V_O$ represents a distance between the optical axis of the lens system of said electron microscope and a point at which the electron beam scattered by the specimen intersects the back focal plane of said objective lens, and $V_A$ represents a distance between said optical axis and a point at which said scattered electron beam intersects said movable aperture element.

3. In an electron microscope, comprising an objective lens, at least one intermediate lens disposed backward of said objective lens, a projector lens disposed backward of said intermediate lens, an objective aperture element disposed adjacent to and backward of said objective lens, and a selected area aperture element disposed downstream of said objective aperture element, the improvement wherein an additional lens is disposed between said objective aperture element and said selected area aperture element, wherein a first crossover is produced at the back focal plane of the objective lens, and the electron beam diverging from said first crossover is again focused at a plane of said selected area aperture element to produce a second crossover by setting magnetic excitation of said intermediate lens at an appropriate level, to thereby restrict the divergence angle of the electron beam scattered by a specimen.

4. An electron microscope comprising an objective lens, an intermediate lens disposed backward of said objective lens, a projector lens disposed backward of said intermediate lens, a movable aperture element disposed at a selected position between a principal plane of said intermediate lens and a principal plane of said projector lens, said objective lens comprising means to produce a first crossover at the back focal plane of said objective lens, said intermediate lens being excited at an appropriate level to comprise means to focus the electron beam diverging from said first crossover at a plane of said movable aperture element to produce a second crossover, to thereby restrict the divergence angle of said electron beam scattered by a specimen.

* * * * *

UNITED STATES PATENT AND TRADEMARK OFFICE
CERTIFICATE OF CORRECTION

PATENT NO. : 4,434,367
DATED : February 28, 1984
INVENTOR(S) : Akira Yonezawa

It is certified that error appears in the above-identified patent and that said Letters Patent are hereby corrected as shown below:

Column 4, line 19, change "projecting" to -- projector --;

Column 4, line 24, change "$Y_O<V_a$" to -- $V_O<V_A$ --;

Column 4, line 62, change "apere" to -- ampere --;

Column 6, line 14, after the equals sign (=), change the numerator of the fraction from "e" to -- -e --;

Column 6, line 55, change "$J/\sqrt{U}$" to -- $J/\sqrt{U_x}$ --

Signed and Sealed this

Twenty-fifth Day of September 1984

[SEAL]

Attest:

Attesting Officer

GERALD J. MOSSINGHOFF

Commissioner of Patents and Trademarks